(12) United States Patent
Chang et al.

(10) Patent No.: US 12,408,300 B2
(45) Date of Patent: Sep. 2, 2025

(54) COOLING SYSTEM

(71) Applicant: DELTA ELECTRONICS, INC., Taoyuan (TW)

(72) Inventors: Ren-Chun Chang, Taoyuan (TW); Shao-Hsuan Lai, Taoyuan (TW); Siang-Lin You, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 404 days.

(21) Appl. No.: 18/167,078

(22) Filed: Feb. 10, 2023

(65) Prior Publication Data

US 2024/0138113 A1 Apr. 25, 2024
US 2024/0237287 A9 Jul. 11, 2024

(30) Foreign Application Priority Data

Oct. 24, 2022 (CN) .......................... 202211304824.9

(51) Int. Cl.
*H05K 7/20* (2006.01)
(52) U.S. Cl.
CPC ..... *H05K 7/20318* (2013.01); *H05K 7/20136* (2013.01); *H05K 7/203* (2013.01); *H05K 7/20309* (2013.01); *H05K 7/20327* (2013.01); *H05K 7/20818* (2013.01)
(58) Field of Classification Search
CPC ........... H05K 7/20318; H05K 7/20136; H05K 7/203; H05K 7/20309; H05K 7/20327; H05K 7/20818; H05K 7/20636; H05K 7/20609; H05K 7/20218; H05K 7/20272; H05K 7/2039
See application file for complete search history.

(56) References Cited

U.S. PATENT DOCUMENTS

| 9,445,530 | B2 | 9/2016 | Reytblat et al. |
| 10,117,362 | B2 | 10/2018 | Noteboom et al. |
| 11,202,394 | B1* | 12/2021 | Weems .............. H05K 7/20818 |
| 11,656,665 | B2* | 5/2023 | Heydari .................... G06F 1/20 |
| | | | 700/300 |

(Continued)

FOREIGN PATENT DOCUMENTS

| CN | 101420839 B | 6/2011 |
| CN | 104754924 B | 2/2016 |
| CN | 205939837 U | 2/2017 |

(Continued)

*Primary Examiner* — Allen R. B. Schult
(74) *Attorney, Agent, or Firm* — CKC & Partners Co., LLC

(57) ABSTRACT

The present disclosure provides a cooling system, including an air-cooling device and a water-cooling device. The air-cooling device includes a first fan, an evaporator, a first condenser, and a second fan. The first fan is arranged in a first cooling room and configured to blow a hot air inside a rack into a first cooling room. The evaporator is arranged in the first cooling room. The first condenser is arranged in a second cooling room. The second fan is arranged in the second cooling room and configured to blow an outside air into the second cooling room. The water-cooling device includes a radiator. The radiator is arranged in the second cooling room and configured to receive a hot liquid from an electronic device in the rack through a third pipeline and transmit a cold liquid to the electronic device through a fourth pipeline.

20 Claims, 10 Drawing Sheets

(56) References Cited

U.S. PATENT DOCUMENTS

| | | | |
|---|---|---|---|
| 11,991,866 B2* | 5/2024 | Salim ................. | H05K 7/20763 |
| 2013/0213071 A1* | 8/2013 | Takahashi ............ | H05K 7/2079 |
| | | | 165/185 |

FOREIGN PATENT DOCUMENTS

| | | |
|---|---|---|
| CN | 105120637 B | 12/2017 |
| CN | 109814690 A | 5/2019 |
| CN | 115209686 A | 10/2022 |
| TW | I237174 B | 8/2005 |
| TW | I240607 B | 9/2005 |
| TW | I289245 B | 11/2007 |
| WO | 2010123660 A2 | 10/2010 |

\* cited by examiner

COOLING SYSTEM

CROSS-REFERENCE TO RELATED APPLICATION

This application claims priority to China application No. 202211304824.9, filed on Oct. 24, 2022, which are herein incorporated by reference in their entirety.

BACKGROUND

Field of Invention

The present disclosure relates to a cooling system. More particularly, the present disclosure relates to a cooling system including an air-cooling device and a water-cooling device.

Description of Related Art

Outdoor communication racks generally include equipment such as power systems and switching mode rectifiers (SMRs). Traditionally, the racks use air-cooling approaches to cool down the equipment and other electronic components. However, as the electronic components inside the chips have better performance, the chips generate more heat as well. Thus, the traditional air-cooling approaches cannot cool down the electronic components efficiently.

SUMMARY

The present disclosure provides a cooling system, including an air-cooling device and a water-cooling device. The air-cooling device includes a first fan, an evaporator, a first condenser, and a second fan. The first fan is arranged in a first cooling room and configured to blow a hot air inside a rack into a first cooling room. The evaporator is arranged in the first cooling room. The first condenser is arranged in a second cooling room. The second fan is arranged in the second cooling room and configured to blow an outside air into the second cooling room. In response to the evaporator receiving the hot air through the first fan, the evaporator is configured to heat a refrigerant into a gaseous state and transmit the refrigerant to the first condenser through a first pipeline. In response to the first condenser receiving the outside air through the second fan, the first condenser is configured to condense the refrigerant into a liquid state and transmit the refrigerant to the evaporator through a second pipeline. The water-cooling device includes a radiator. The radiator is arranged in the second cooling room and configured to receive a hot liquid from an electronic device in the rack through a third pipeline and transmit a cold liquid to the electronic device through a fourth pipeline. In response to the radiator receiving the outside air through the second fan, the radiator is configured to cool down the hot liquid to the cold liquid.

The present disclosure also provides a cooling system, including a plate heat exchanger, a first fan, a second fan, and a water-cooling device. The plate heat exchanger includes plates. The plates are configured to form at least one hot air channel and at least one cool air channel. The first fan is configured to blow a hot air inside a rack into the at least one hot air channel of the plate heat exchanger. The second fan is configured to blow an outside air into the at least one cool air channel of the plate heat exchanger. In response to the hot air flows through the at least one hot air channel and the outside air flows through the at least one cool air channel, the plates are configured to cool down the hot air. The water-cooling device includes a radiator. The radiator is configured to receive a hot liquid from an electronic device in the rack through a first pipeline and transmit a cold liquid to the electronic device through a second pipeline. In response to the radiator receiving the outside air through the second fan, the radiator is configured to cool down the hot liquid to the cold liquid.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
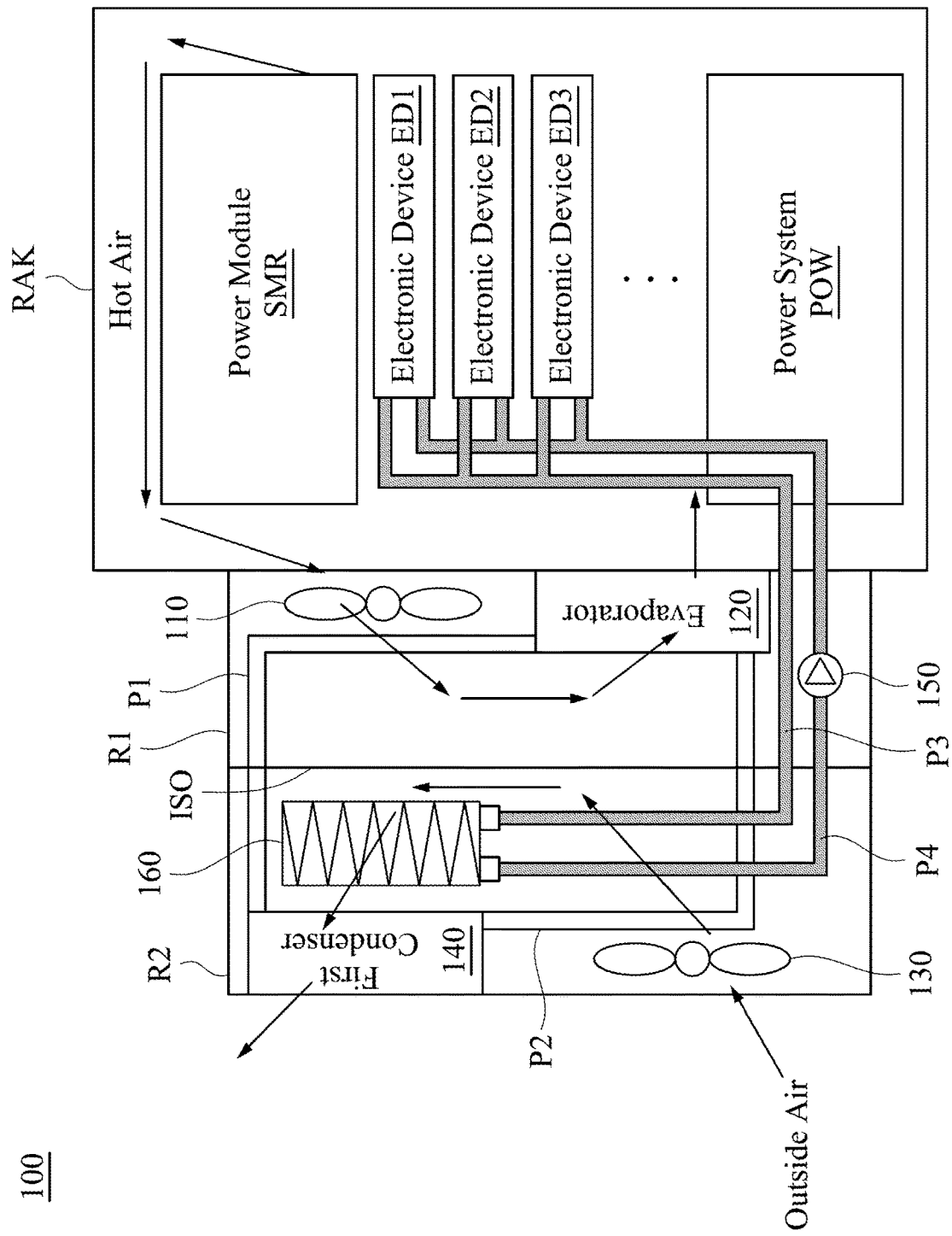
FIG. 1 is a diagram of a cooling system in accordance with some embodiments of the present disclosure.

Reference will now be made in detail to embodiments of the present disclosure, examples of which are described herein and illustrated in the accompanying drawings. While the disclosure will be described in conjunction with embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. It is noted that, in accordance with the standard practice in the industry, the drawings are only used for understanding and are not drawn to scale. Hence, the drawings are not meant to limit the actual embodiments of the present disclosure. In fact, the dimensions of the various features may be arbitrarily increased or reduced for clarity of discussion. Wherever possible, the same reference numbers are used in the drawings and the description to refer to the same or like parts for better understanding.

The terms used in this specification generally have their ordinary meanings in the art, within the context of the invention, and in the specific context where each term is used.

As used in the present disclosure, the terms "comprising," "including," "having," "containing," "involving," and the like are to be understood to be open-ended, i.e., to mean including but not limiting to. In addition, as used in the present disclosure, the term "and/or" includes any and all combinations of one or more of the associated listed items. Moreover, it will be understood that, although the terms "first," "second," etc., may be used herein to describe various elements, these elements should not be limited by these terms. These terms are used to distinguish one element from another.

Some embodiments of the present disclosure provide a cooling system. Reference is now made to FIG. 1. FIG. 1 is a diagram of a cooling system 100 in accordance with some embodiments of the present disclosure. The cooling system 100 is configured to lower a temperature inside a rack RAK. In some embodiments, the rack RAK is arranged outdoor and is configured to accommodate communication equipment. A power module SMR is configured to convert alternative current (AC) to direct current (DC) and transmit the direct current to a power system POW. The power system POW is configured to provide power to electronic devices ED1-ED3. The power module SMR, the power system POW, and the electronic devices ED1-ED3 generate heat during operation, and thus a hot air is generated inside the rack RAK as shown in FIG. 1.

In some embodiments, the electronic devices ED1-ED3 are central processing units (CPUs), graphics processing units (GPUs), or other chips for computing and processing communication data and information. In some embodiments, the electronic devices ED1-ED3 with higher computing power or performance generate more heat during operation.

For illustration of FIG. 1, the cooling system 100 includes a first fan 110, and a second fan 130, an evaporator 120, a first condenser 140, and a radiator 160, The first fan 110 and the evaporator 120 are arranged in a first cooling room R1, and the second fan 130, the first condenser 140, and the radiator 160 are arranged in a second cooling room R2. The evaporator 120 and the first condenser 140 are connected to each other through a first pipeline P1 and a second pipeline P2. The radiator 160 is connected to the electronic devices ED1-ED3 through a third pipeline P3 and a fourth pipeline P4.

In some embodiments, as shown in FIG. 1, the first cooling room R1 and the second cooling room R2 are arranged at the same side with respect to the rack RAK, and the first cooling room R1 is arranged between the second cooling room R2 and the rack RAK.

In some embodiments, the air inside the first cooling room R1 and the air inside the rack RAK communicate with each other through a hole (not shown in FIG. 1), and the air inside the second cooling room R2 and the outside air of the outdoor environment communicate with each other through another hole (not shown in FIG. 1).

In some embodiments, the cooling system 100 further includes an isolation wall ISO. As shown in FIG. 1, the first cooling room R1 and the second cooling room R2 are separated from each other by the isolation wall ISO. Alternatively stated, the isolation wall ISO is arranged between the first cooling room R1 and the second cooling room R2.

The isolation wall ISO is configured to prevent the hot air blown into the first cooling room R1 by the first fan 110 from flowing into the second cooling room R2 and to prevent the outside air blown into the second cooling room R2 by the second fan 130 from flowing into the first cooling room R1.

In some embodiments, at least one hole (not shown in FIG. 1) is arranged at the isolation wall ISO, and the at least one hole is configured for the first pipeline P1, the second pipeline P2, the third pipeline P3, and the fourth pipeline P4 to pass through the isolation wall ISO. In some embodiments, four holes (not shown in FIG. 1) are arranged at the isolation wall ISO, and are configured for the first pipeline P1, the second pipeline P2, the third pipeline P3, and the fourth pipeline P4 to pass through the isolation wall ISO respectively.

Accordingly, the isolation wall ISO is configured to prevent the air from flowing between the first cooling room R1 and the second cooling room R2, allow a refrigerant to be transmitted between the evaporator 120 and the first condenser 140 through the first pipeline P1 and the second pipeline P2, and allow a fluid to be transmitted between the electronic devices ED1-ED3 and the radiator 160 through the third pipeline P3 and the fourth pipeline P4.

It is worth noting that the configuration of the embodiment in FIG. 1 is merely exemplary and does not intend to limit the embodiments of the present disclosure. In various embodiments, structures and relative positions of the first cooling room R1, the second cooling room R2, and the rack RAK are different from the embodiment of FIG. 1.

In some embodiments, the cooling system 100 uses an air-cooling device and a water-cooling device to lower the temperature inside the rack RAK. Alternatively stated, the components of the cooling system 100 can be categorized and/or divided into the air-cooling device(s) and the water-cooling device(s). As the first fan 110, the second fan 130, the evaporator 120, the first condenser 140, the first pipeline P1, and the second pipeline P2 are configured to use air as media to bring heat outside the rack RAK, these components are referred to as the air-cooling device(s). As the radiator 160, the third pipeline P3, and the fourth pipeline P4 are configured to use fluid as media to bring heat outside the rack RAK, these components are referred to as the water-cooling device(s). Paragraphs below describe details regarding the operations of these components in the cooling system 100.

In some embodiments, as shown in FIG. 1, the first fan 110 is arranged at a relatively high position, and the second fan 130 is arranged at a relatively low position. Alternatively stated, in the direction perpendicular to the ground, the first fan 110 is higher, and the second fan 130 is lower.

For illustration of FIG. 1, when the power module SMR, the power system POW, and the electronic devices ED1-ED3 in the rack RAK generate the hot air, the first fan 110 is configured to blow the hot air inside the rack RAK into the first cooling room R1. In some embodiments, the first fan 110 is arranged in the first cooling room R1, and a hole (not shown in FIG. 1) is arranged at a position adjacent to the first fan 110 between the first cooling room R1 and the rack RAK, so that the first fan 110 can blow the hot air from the rack RAK into the first cooling room R1 through the hole.

For illustration of FIG. 1, after the first fan 110 blows the hot air into the first cooling room R1, the isolation wall ISO is further configured for the hot air to flow along a side of the isolation wall ISO to the evaporator.

For illustration of FIG. 1, when the hot air coming from the rack RAK is blowed to the evaporator 120 by the first fan 110, the evaporator 120 is configured to heat a refrigerant in the evaporator 120 into a gaseous state and transmit the refrigerant to the first condenser 140 through the first pipeline P1. In some embodiments, the evaporator 120 is configured to store a liquid-state refrigerant (refrigerant in the liquid state). When the evaporator 120 receives the hot air coming from the rack RAK through the first fan 110, the liquid-state refrigerant in the evaporator 120 is heated to a certain temperature and is converted into the gaseous state. The gaseous-state refrigerant (refrigerant in the gaseous state) will rise in and along the first pipeline P1 and then be transmitted to the first condenser 140.

Figure 2B:
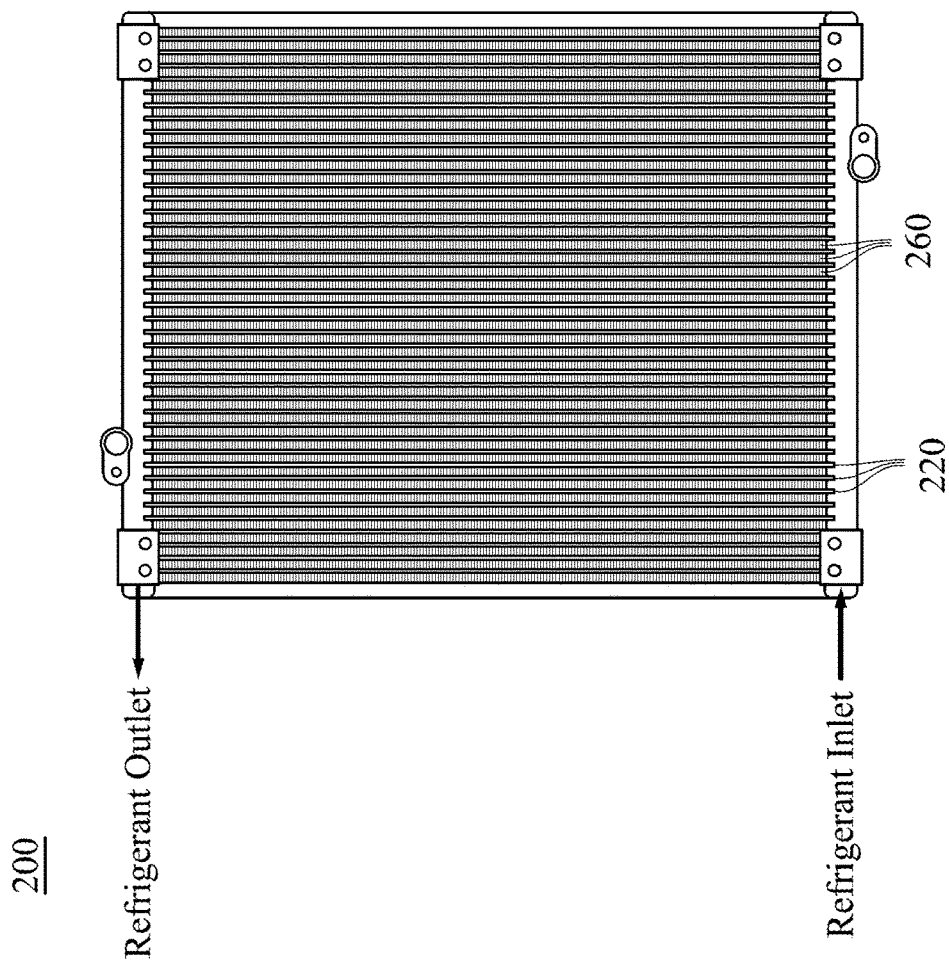
FIG. 2B is a diagram of the first condenser and the evaporator as shown in FIG. 1 in accordance with some embodiments of the present disclosure.
Figure 2A:
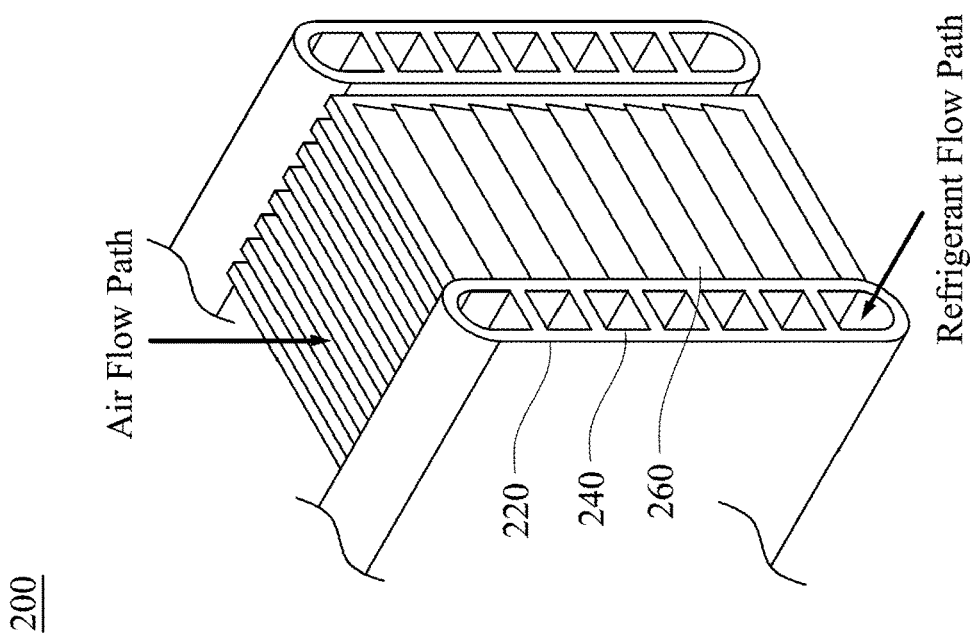
FIG. 2A is a diagram of a first condenser and an evaporator as shown in FIG. 1 in accordance with some embodiments of the present disclosure.

Reference is now made to FIGS. 2A-2B. FIGS. 2A-2B are diagrams of the first condenser 140 and the evaporator 120 as shown in FIG. 1 in accordance with some embodiments of the present disclosure. In some embodiments, the evaporator 120 in FIG. 1 has the configuration of the condenser/evaporator 200 as shown in FIGS. 2A-2B. As shown in FIGS. 2A-2B, the condenser/evaporator 200 includes parallel-flow flat tubes 220 that are arranged to be adjacent to each other. Each of the parallel-flow flat tubes 220 is connected to a refrigerant inlet and a refrigerant outlet and includes multiple micro channels 240. The micro channels 240 are configured as paths for transmitting the refrigerant. Multiple cooling fins 260 are arranged between any two of the parallel-flow flat tubes 220. The cooling fins 260 contact the adjacent parallel-flow flat tubes 220 and are configured for the liquid or the refrigerant in the micro tubes and the air passing through the cooling fins 260 to exchange heat.

In some embodiments, when the refrigerant passes through the micro channels 240 in the parallel-flow flat tubes 220, because the hot air coming from the rack RAK passes through the cooling fins 260 and transmits heat to the cooling fins 260, the cooling fins 260 are configured to transmit the heat to the parallel-flow flat tubes 220, and the parallel-flow flat tubes 220 are configured to transmit the heat to the refrigerant inside the micro channels 240. Accordingly, the condenser/evaporator 200 is configured to absorb the heat of the hot air and then heat the refrigerant into the gaseous state.

In some embodiments, when the liquid-state refrigerant is heated to a certain temperature, the liquid-state refrigerant converts into the gaseous-state refrigerant. In some embodiments, when the gaseous-state refrigerant is cooled down to a certain temperature, the gaseous-state refrigerant is converted into the liquid-state refrigerant.

Reference is made to FIG. 1 again. The second fan 130 is configured to blow the outside air into the second cooling room R2. In some embodiments, the second fan 130 is arranged in the second cooling room R2, and the second cooling room R2 includes a hole (not shown in FIG. 1) that is arranged at a position adjacent to the second fan 130, so that the second fan 130 can blow the outside air from the outdoor environment into the second cooling room R2 through the hole.

For illustration of FIG. 1, after the second fan 130 blows the outside air into the second cooling room R2, the isolation wall ISO is further configured for the outside air to flow along the isolation wall ISO to the first condenser 140.

For illustration of FIG. 1, after the first condenser 140 receives the gaseous-state refrigerant through the first pipeline P1, when the first condenser 140 receives the outside air through the second fan 130, the first condenser 140 is configured to condense the gaseous-state refrigerant into the liquid state and transmit the liquid-state refrigerant to the evaporator 120 through the second pipeline P2. Alternatively stated, when the gaseous-state refrigerant in the first condenser 140 is cooled down to a certain temperature, the gaseous-state refrigerant is converted into the liquid-state refrigerant. The liquid-state refrigerant will flow downward along the second pipeline P2 due to gravity and then be transmitted to the evaporator 120.

In some embodiments, the second cooling room R2 further includes a hole (not shown in FIG. 1) that is arranged at a position adjacent to the first condenser 140, and the hole is connected to the outdoor environment. After the outside air flows through the first condenser 140 and absorbs the heat from the refrigerant in the first condenser 140, the outside air will flow out of the second cooling room R2 through this hole. Thus, the heat is transmitted out of the rack RAK and to the outdoor environment.

In some embodiments, the first condenser 140 in FIG. 1 has the configuration of the condenser/evaporator 200 as shown in FIGS. 2A-2B. When the refrigerant passes through the micro channels 240 in the parallel-flow flat tubes 220 and the outside air flows through the air flow paths of the condenser/evaporator 200, the cooling fins 260 are configured to transmit the heat coming from the gaseous-state refrigerant in the micro channels 240 to the outsider air that flows through and contacts the cooling fins 260. Accordingly, the condenser/evaporator 200 is configured to transmit the heat of the gaseous-state refrigerant to the outside air, allowing the gaseous-state refrigerant to be condensed into the liquid-state refrigerant.

In some embodiments, as shown in FIG. 1, after the first condenser 140 transmits the liquid-state refrigerant to the evaporator 120 through the second pipeline P2, when the evaporator 120 receives the liquid-state refrigerant through the second pipeline P2, the first fan 110 is further configured to blow into the rack RAK the cool air that is cooled down by the liquid-state refrigerant in the evaporator 120.

In some embodiments, a hole (not shown in FIG. 1) is arranged at a position adjacent to the evaporator 120 between the first cooling room R1 and the rack RAK. When the evaporator 120 receives the cooled liquid-state refrigerant, the air blown out by the first fan 110 passes through the evaporator 120 and then flows into the rack RAK through the hole mentioned above. Because the evaporator 120 includes the cooled liquid-state refrigerant, the air passing through the evaporator 120 will exchange heat with the refrigerant in the evaporator 120 and be cooled down, so the cool air will flow back into the rack RAK.

Through the configuration of the first fan 110, the second fan 130, the evaporator 120, the first condenser 140, the first pipeline P1, and the second pipeline P2, the heat of the hot air inside the rack RAK is transmitted to the refrigerant, the heat of the refrigerant is then transmitted to the outside air, and the heat of the outside air is eventually transmitted to the outdoor environment. Accordingly, the cooling system 100 transmits a portion of the heat in the rack RAK out of the rack RAK through the air-cooling devices.

As discussed above, in some embodiments, the electronic devices ED1-ED3 will generate great heat during operation, and the cooling system 100 transmits the heat generated by the electronic devices ED1-ED3 out of the rack RAK through the water-cooling devices. Paragraphs below describe the operations of the water-cooling devices in the cooling system 100.

For illustration of FIG. 1, the radiator 160 is arranged in the second cooling room R2 and is configured to receive a hot liquid from the electronic devices ED1-ED3 in the rack RAK through a third pipeline P3, and transmit a cold liquid to the electronic devices ED1-ED3 through a fourth pipeline P4. Alternatively stated, the electronic devices ED1-ED3 generate heat during operation, and the third pipeline P3 and the fourth pipeline P4 are configured to transmit liquid between the electronic devices ED1-ED3 and the radiator 160, in order to exhaust the heat out of the rack RAK through the liquid.

In some embodiments, after the liquid receives the heat generated by the electronic devices ED1-ED3, the third pipeline P3 is configured to transmit the heat to the radiator 160. After the radiator 160 cools down the hot liquid to the cold liquid, the fourth pipeline P4 is configured to transmit the cold liquid back to the electronic devices ED1-ED3, and then the cold liquid can exchange heat with the electronic devices ED1-ED3.

In some embodiments, as shown in FIG. 1, when the radiator 160 receives the outside air through the second fan 130, the radiator 160 is configured to cool down the hot liquid into the cold liquid. Alternatively stated, when the outside air passes through the radiator 160, the outside air exchanges heat with the hot liquid in the radiator 160, so that the hot liquid is cooled down into the cold liquid.

In some embodiments, as shown in FIG. 1, through the configuration of the cooling system 100 as shown in FIG. 1, after the outside air is blown into the second cooling room R2 by the second fan 130, the outside air passes through the radiator 160 first, then the first condenser 140, and flows out to the outdoor environment through the hole adjacent to the first condenser 140. In various embodiments, the cooling system 100 has a configuration different from the one shown in FIG. 1. After the outside air is blown into the second cooling room R2 by the second fan 130, the outside air passes through the first condenser 140 first, then the radiator 160, and flows out to the outdoor environment through the hole.

Figure 3:
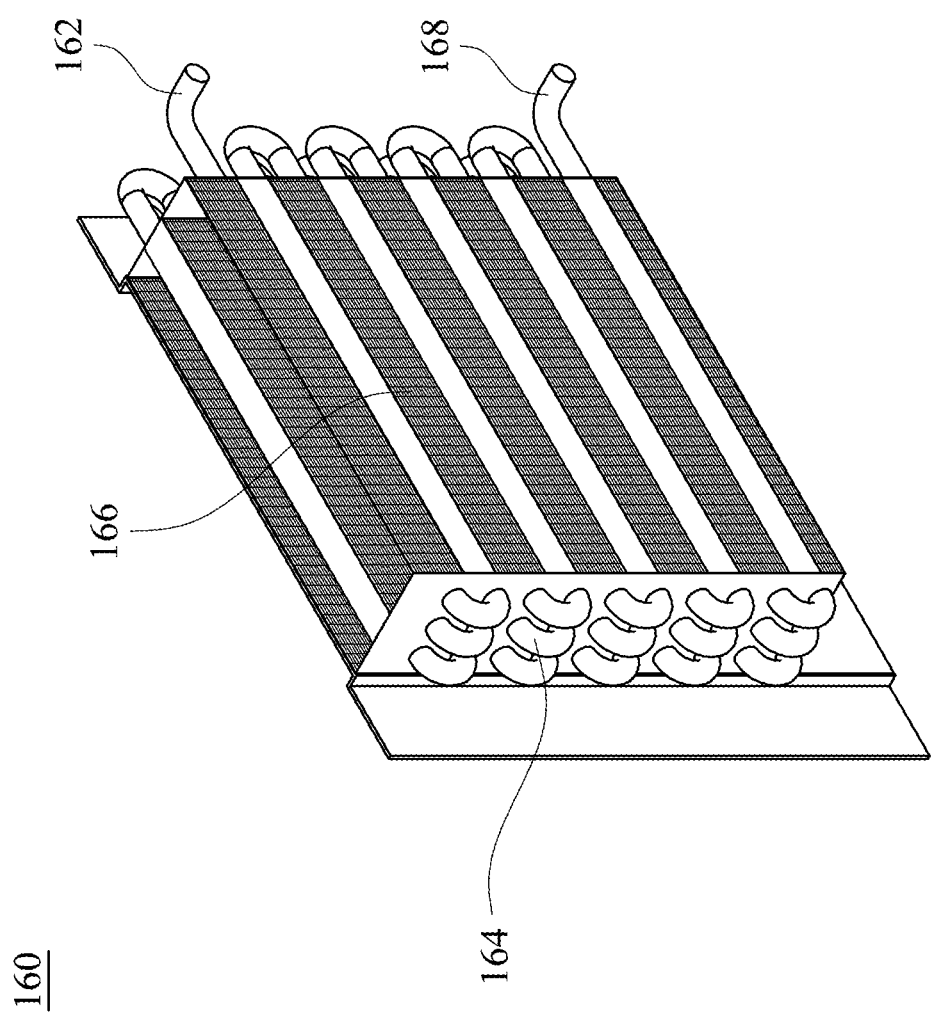
FIG. 3 is a diagram of a radiator as shown in FIG. 1 in accordance with some embodiments of the present disclosure.

Reference is now made to FIG. 3. FIG. 3 is a diagram of the radiator 160 as shown in FIG. 1 in accordance with some embodiments of the present disclosure. In some embodiments, the radiator 160 includes openings 162 and 168, a pipe structure 164, and a fin structure 166. The opening 162 is configured for the radiator 160 to connect to the third pipeline P3 in FIG. 1 and receive the hot liquid from the electronic devices ED1-ED3. The opening 168 is configured for the radiator 160 to connect to the fourth pipeline P4 in FIG. 1 and transmit the cold liquid to the electronic devices ED1-ED3. The pipe structure 164 has a winding structure. The fin structure 166 is arranged around the pipe structure 164 and is configured for the liquid in the pipe structure 164 to exchange heat with the air passing through the fin structure 166. For example, when the outside air passes through the radiator 160 and makes contact with the fin structure 166 of the radiator 160, the outside air exchanges heat with the hot liquid in the pipe structure 164, so that the hot liquid is cooled down in the cold liquid.

In some embodiments, as shown in FIG. 1, the cooling system 100 further includes a pump 150. The pump 150 is arranged at a portion of the fourth pipeline P4. When the cold liquid flows to the pump 150 through the fourth pipeline P4, the pump 150 is configured to apply pressure to the cold liquid to increase the velocity of the cold liquid, in order to transmit the cold liquid to the electronic devices ED1-ED3. In various embodiments, the pump 150 is arranged at a portion of the third pipeline P3. When the hot liquid flows to the pump 150 through the third pipeline P3, the pump 150 is configured to increase the velocity of the hot liquid.

Through the configuration of the radiator 160, the pump 150, the third pipeline P3, and the fourth pipeline P4 mentioned above, the heat generated by the electronic devices ED1-ED3 is transmitted out of the rack RAK through the liquid. Accordingly, the cooling system 100 transmits the heat generated by the electronic devices ED1-ED3 in the rack RAK outside the rack RAK through the water-cooling devices.

Figure 4A:
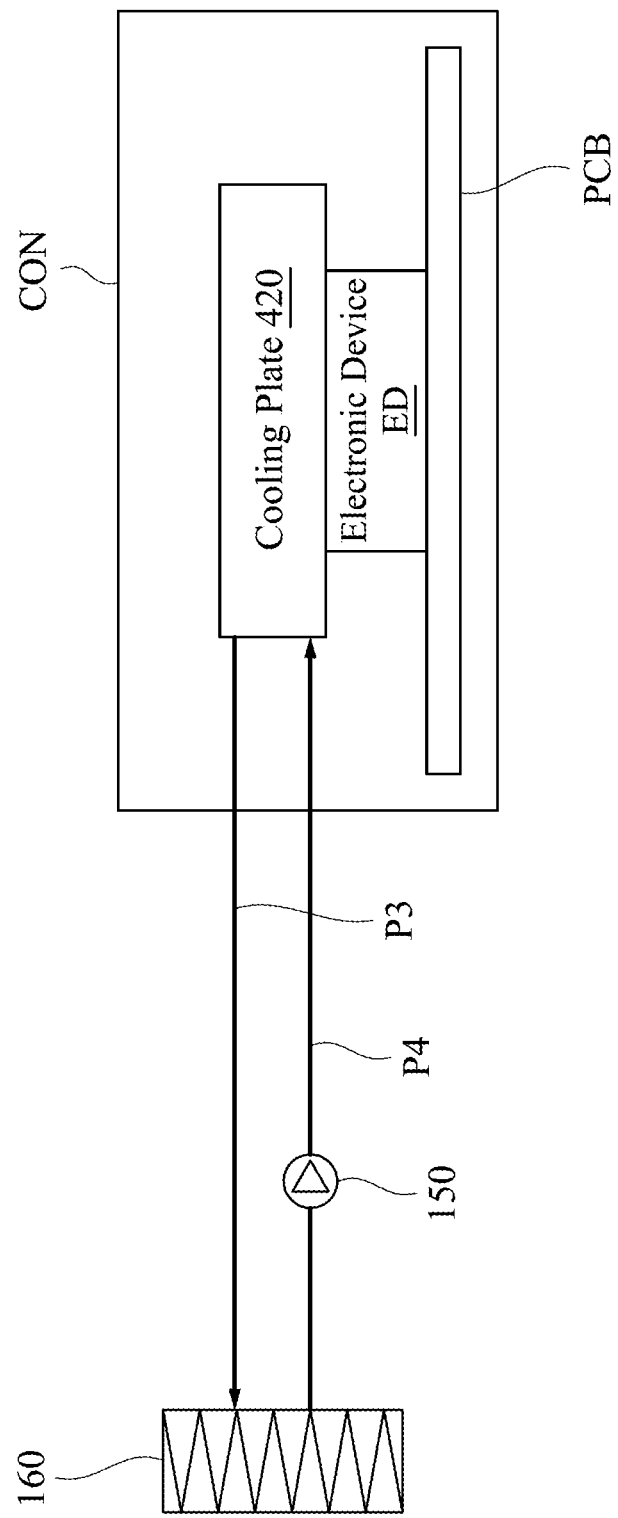
FIG. 4A is a diagram of a portion of the cooling system as shown in FIG. 1 in accordance with some embodiments of the present disclosure.

In some embodiments, the liquid transmitted by the third pipeline P3 and the fourth pipeline P4 exchanges heat with the electronic devices ED1-ED3 through a cooling plate. Reference is now made to FIG. 4A. FIG. 4A is a diagram of a portion of the cooling system 100 as shown in FIG. 1 in accordance with some embodiments of the present disclosure. FIG. 4A merely illustrates the water-cooling devices in the cooling system 100 that include the radiator 160, the pump 150, the third pipeline P3 and the fourth pipeline P4. The air-cooling devices are omitted in FIG. 4A.

For illustration of FIG. 4A, in a tank CON, an electronic device ED is arranged on a circuit board PCB, and a cooling plate 420 is arranged on the electronic device ED and contacts the electronic device ED. The cooling plate 420 is configured to transmit the hot liquid to the radiator 160 through the third pipeline P3, receive the cold liquid from the radiator 160 through the fourth pipeline P4, and allow the liquid to exchange heat with the electronic device ED by contacting the electronic device ED.

Figure 4B:
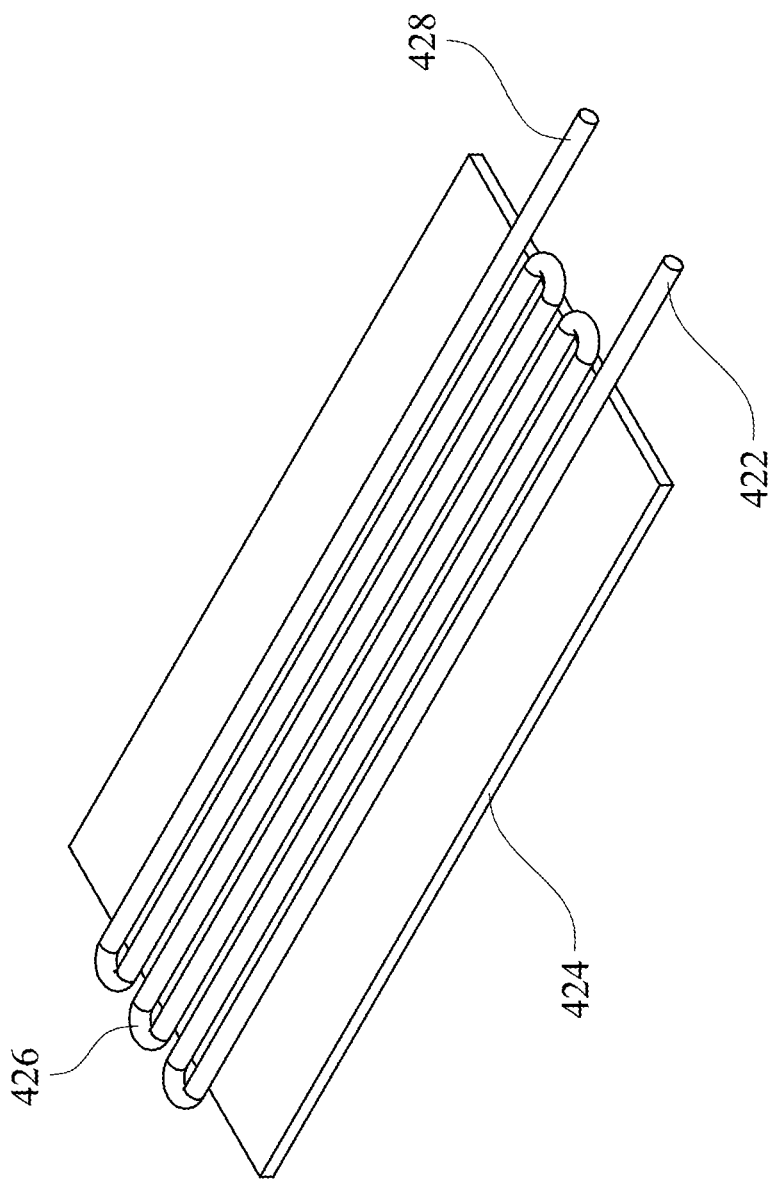
FIG. 4B is a diagram of a cooling plate as shown in FIG. 4A in accordance with some embodiments of the present disclosure.

Reference is now made to FIG. 4B. FIG. 4B is a diagram of the cooling plate 420 as shown in FIG. 4A in accordance with some embodiments of the present disclosure. In some embodiments, the cooling plate 420 includes a pipe structure 426 and a plate structure 424. The pipe structure 426 includes openings 422 and 428. The openings 422 and 428 are configured for the pipe structure 426 to connect to the third pipeline P3 and the fourth pipeline P4 respectively. The pipe structure 426 is arranged on the plate structure 424 and contacts the plate structure 424. The plate structure 424 is configured to contact the electronic device ED. In some embodiments, the plate structure 424 includes materials with high thermal conductivity.

For illustration of FIG. 4A, when the cold liquid is transmitted to the cooling plate 420 through the fourth pipeline P4, the cold liquid exchanges heat with the electronic device ED through the cooling plate 420, and the cold liquid is heated into the hot liquid after receiving the heat generated by the electronic device ED. The hot liquid is transmitted to the radiator 160 through the third pipeline P3, and the radiator 160 cools down the hot liquid into the cold liquid as described in previous embodiments. In some embodiments, the cooling plate 420 is referred to as a water-cooling plate.

Figure 5:
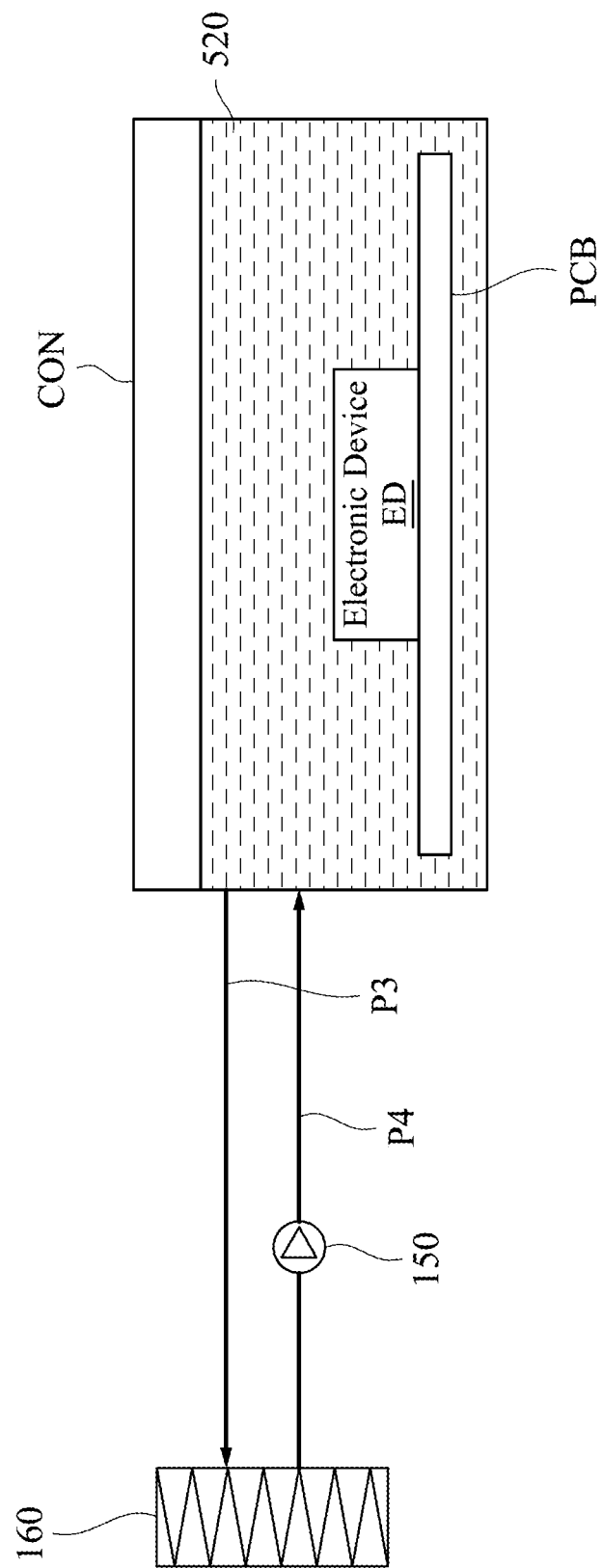
FIG. 5 is a diagram of a portion of the cooling system as shown in FIG. 1 in accordance with some embodiments of the present disclosure.

Reference is now made to FIG. 5. FIG. 5 is a diagram of a portion of the cooling system 100 as shown in FIG. 1 in accordance with some embodiments of the present disclosure. FIG. 5 merely illustrates the water-cooling devices in the cooling system 100, and the air-cooling devices in the cooling system 100 are omitted in FIG. 5. In some embodiments, as shown in FIG. 5, the tank CON is configured to store a dielectric fluid 520 and soak the electronic device ED into the dielectric fluid 520. Alternatively stated, the electronic device ED is soaked into the dielectric fluid 520 and contacts the dielectric fluid 520 in order to exchange heat with the dielectric fluid 520. After the dielectric fluid 520 absorbs the heat from the electronic device ED, the third pipeline P3 is configured to transmit the dielectric fluid 520 from the tank CON to the radiator 160. After the radiator 160 cools down the dielectric fluid 520, the fourth pipeline P4 is configured to transmit the cooled dielectric fluid 520 back to the tank CON.

In some embodiments, the dielectric fluid 520 includes electrical insulating substances, such as oil, fluorides, and others alike.

Figure 6A:
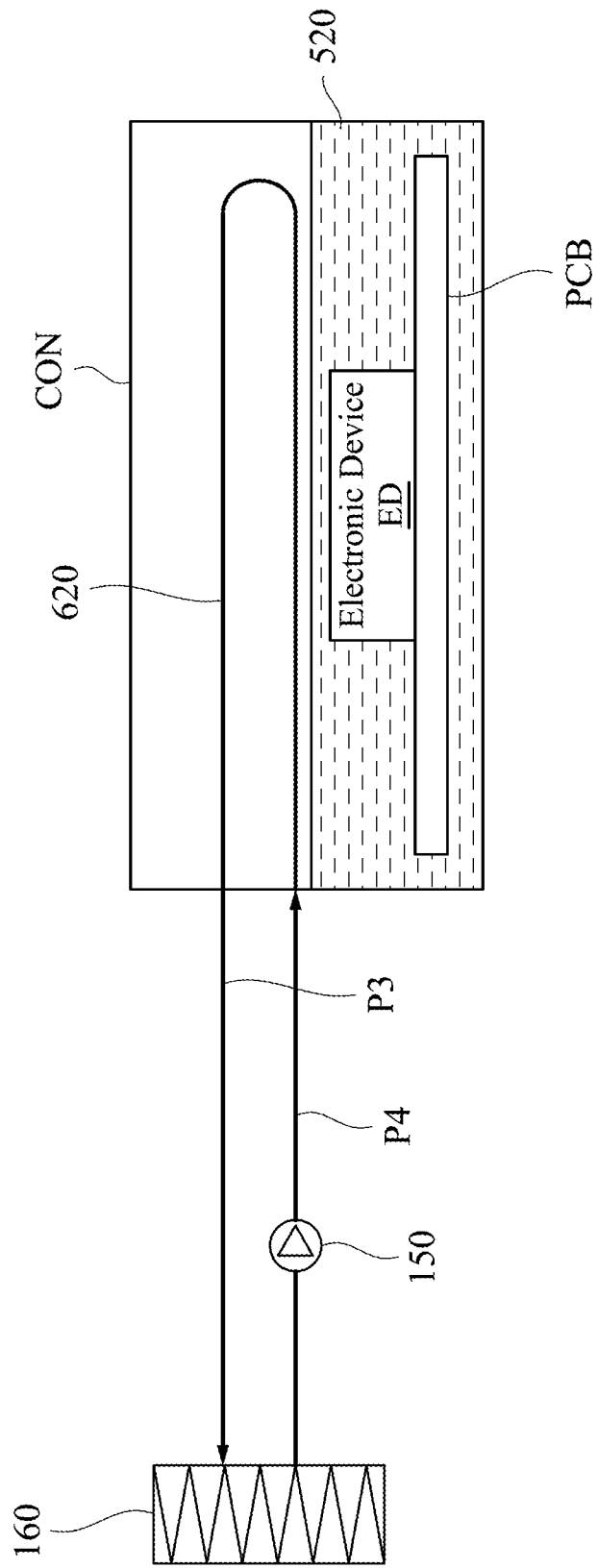
FIG. 6A is a diagram of a portion of the cooling system as shown in FIG. 1 in accordance with some embodiments of the present disclosure.

Reference is now made to FIG. 6A. FIG. 6A is a diagram of a portion of the cooling system 100 as shown in FIG. 1 in accordance with some embodiments of the present disclosure. FIG. 6A merely illustrates the water-cooling devices in the cooling system 100, and the air-cooling devices in the cooling system 100 are omitted. In some embodiments, compared with the embodiment of FIG. 5, in the embodiment of FIG. 6A, the cooling system 100 further includes a second condenser 620. The second condenser 620 is arranged in the tank CON and is connected to the third pipeline P3 and the fourth pipeline P4.

In some embodiments, as shown in FIG. 6A, the boiling point of the dielectric fluid 520 is below 100° C. For example, the boiling point of the dielectric fluid 520 is between 50° C. and 65° C. When the dielectric fluid 520 is heated above its boiling point by the electronic device ED, the dielectric fluid 520 is converted from the liquid state into the gaseous state, and the second condenser 620 is configured to condense the dielectric fluid 520 into the liquid state. Alternatively stated, the liquid-state dielectric fluid 520 is converted into the gaseous-state dielectric fluid 520, and the tank CON is filled with the gaseous-state dielectric fluid 520. When the gaseous-state dielectric fluid 520 contacts the second condenser 620, because the cold liquid coming from the fourth pipeline P4 flows through the second condenser 620, the gaseous-state dielectric fluid 520 with a relatively high temperature will condense on the surface of the second condenser 620 that has a relatively low temperature due to the cold liquid.

When the gaseous-state dielectric fluid 520 condense on the second condenser 620, the dielectric fluid 520 exchanges heat with the cold liquid in the second condenser 620, so that the cold liquid in the second condenser 620 is heated into the hot liquid. The second condenser 620 then transmits the hot liquid to the radiator 160 through the radiator 160. The dielectric fluid 520 condensed on the second condenser 620 is converted back into the liquid state and remains in the tank CON.

Different from the embodiment of FIG. 5, in the embodiment of FIG. 6A, the liquid in the third pipeline P3, the fourth pipeline P4, the second condenser 620, and the radiator 160 is separated from the dielectric fluid 520 in the tank CON. In the embodiment of FIG. 5, the dielectric fluid 520 flows in the third pipeline P3, the fourth pipeline P4, and the radiator 160.

Figure 6B:
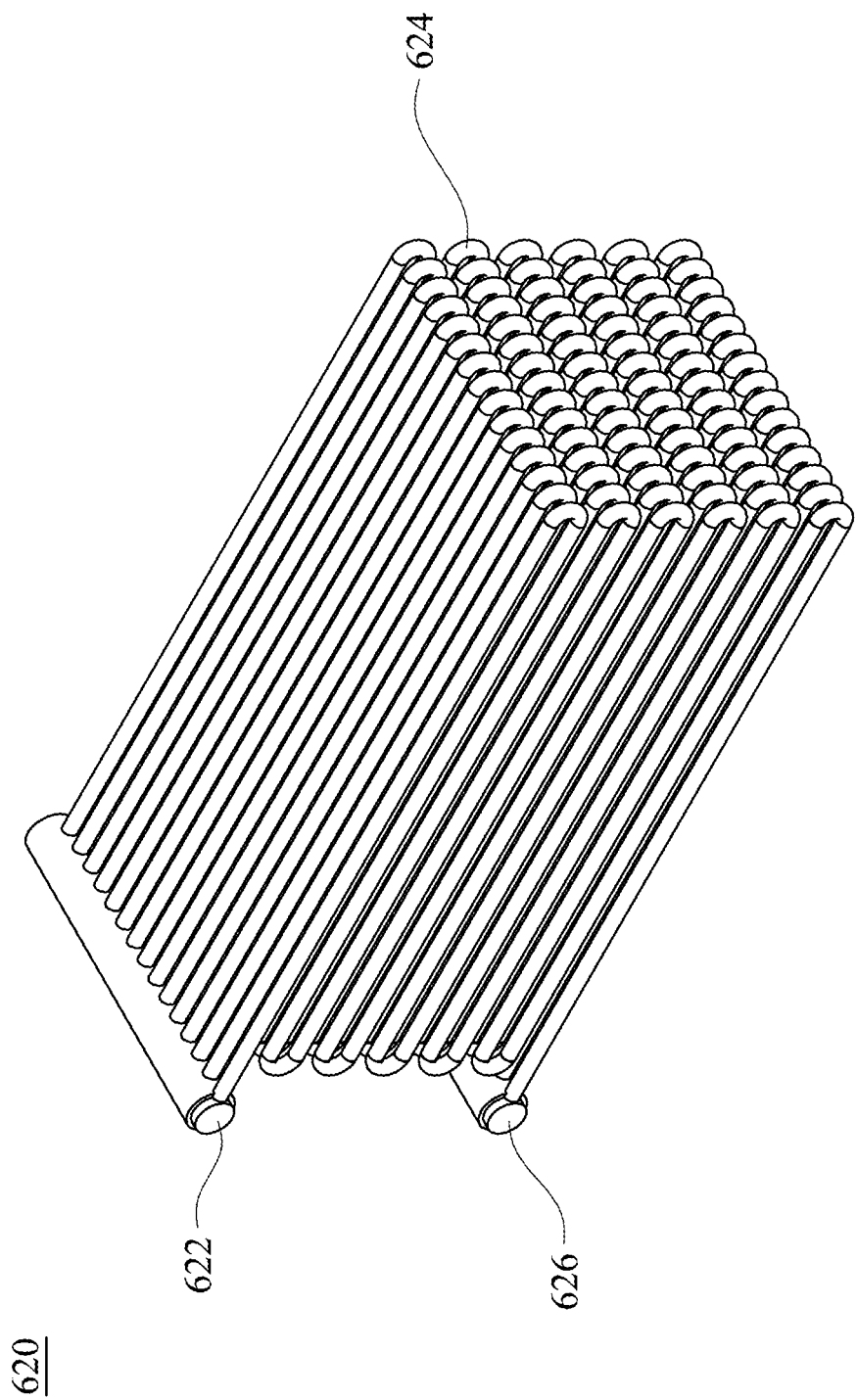
FIG. 6B is a diagram of a second condenser as shown in FIG. 6A in accordance with some embodiments of the present disclosure.

Reference is now made to FIG. 6B. FIG. 6B is a diagram of the second condenser 620 as shown in FIG. 6A in accordance with some embodiments of the present disclosure. In some embodiments, the second condenser 620 includes openings 622 and 626 and a pipe structure 624. The opening 626 is configured to connect the fourth pipeline P4, in order to receive the cold liquid from the radiator 160 and transmit the cold liquid to the pipe structure 624. The opening 622 is configured to connect the third pipeline P3, in order to transmit the hot liquid to the radiator 160. When the liquid flows in the pipe structure 624, the pipe structure 624 is configured to condense the heated gaseous-state dielectric fluid 520 onto the surface of the pipe structure 624, which allows the dielectric fluid 520 to exchange heat with the liquid in the pipe structure 624.

The water-cooling devices described in the embodiments of FIGS. 4A, 5, and 6A can be used in the cooling system 100 shown in FIG. 1 to exhaust the heat generated by the electronic devices ED1-ED3 as shown in FIG. 1.

Figure 7A:
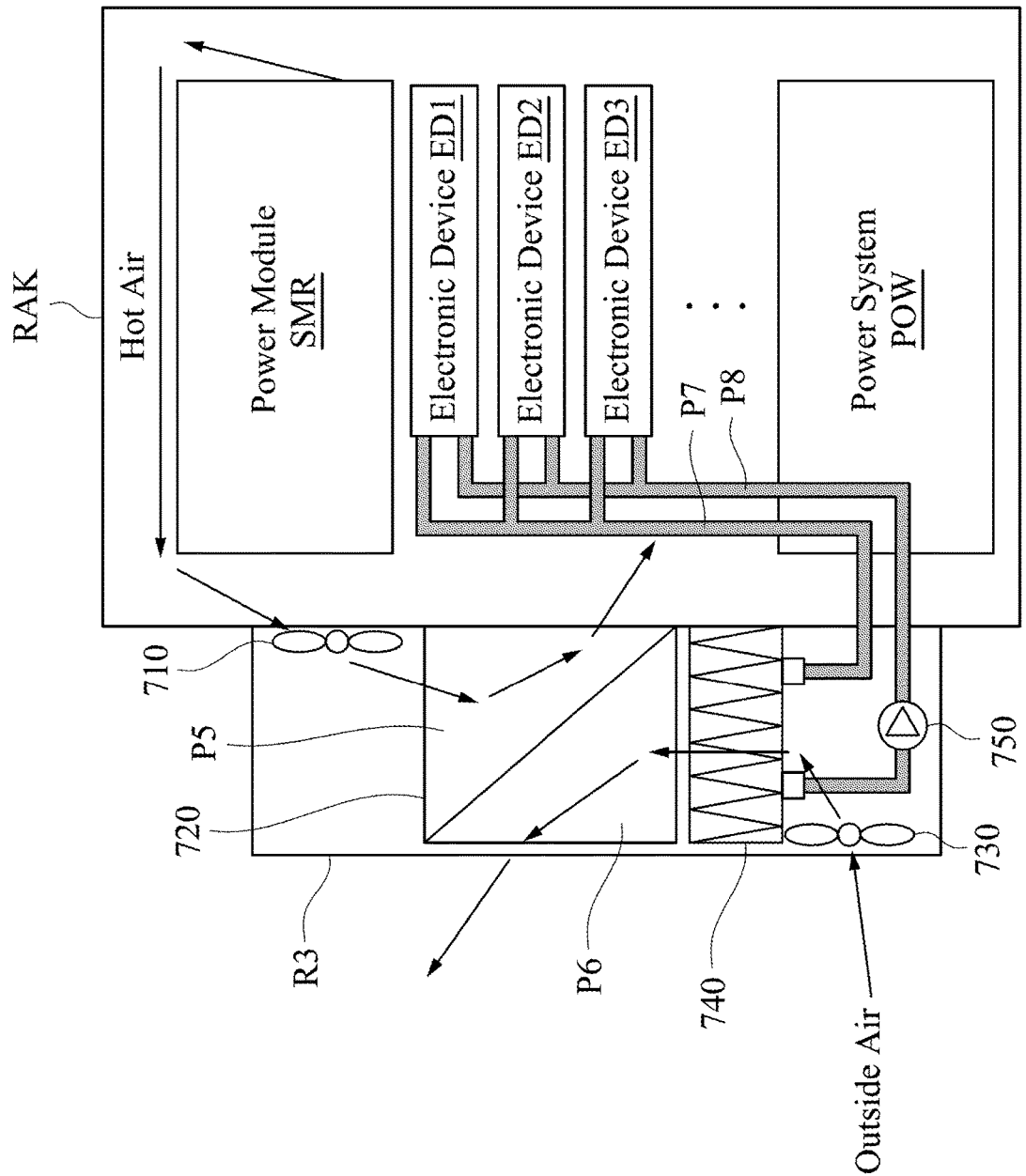
FIG. 7A is a diagram of a cooling system in accordance with some embodiments of the present disclosure.

Some embodiments of the present disclosure provide another cooling system. Reference is now made to FIG. 7A. FIG. 7A is a diagram of a cooling system 700 in accordance with some embodiments of the present disclosure. The cooling system 700 includes a first fan 710, a second fan 730, a plate heat exchanger 720, a radiator 740, and a pump 750.

In some embodiments, as shown in FIG. 7A, the first fan 710, the second fan 730, the plate heat exchanger 720, the radiator 740, and the pump 750 are arranged in a cooling room R3.

Figure 7C:
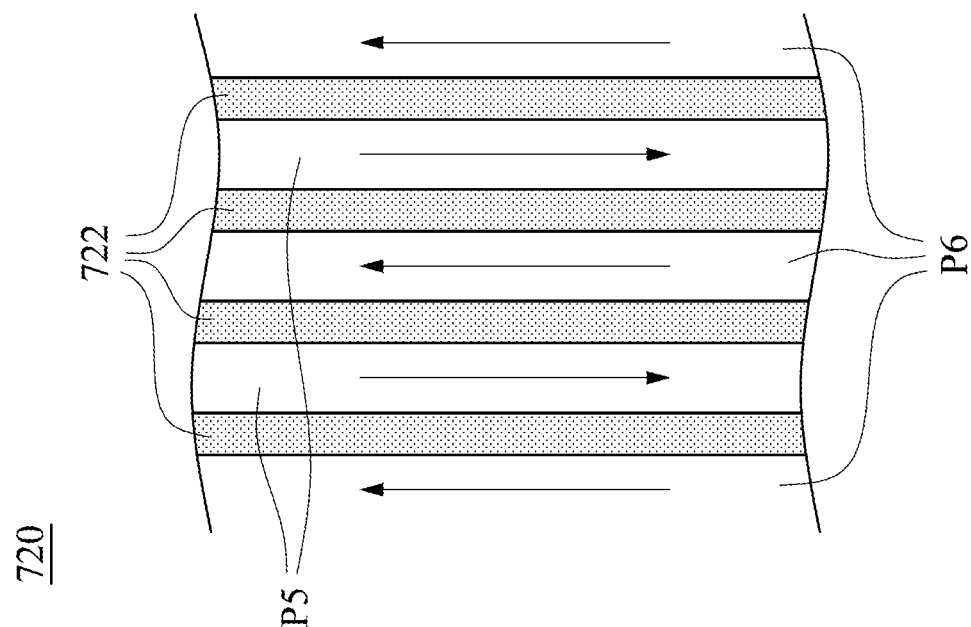
FIG. 7C is a diagram of the plate heat exchanger as shown in FIG. 7A in accordance with some embodiments of the present disclosure.
Figure 7B:
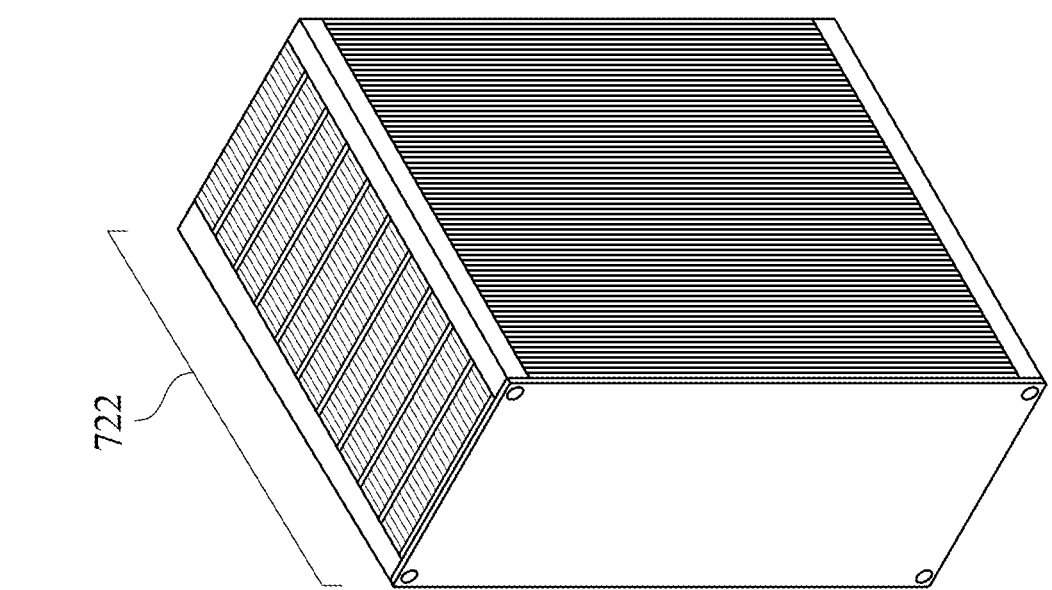
FIG. 7B is a diagram of a plate heat exchanger as shown in FIG. 7A in accordance with some embodiments of the present disclosure.

Reference is now made to FIGS. 7B-7C. FIGS. 7B-7C are diagrams of the plate heat exchanger 720 as shown in FIG. 7A in accordance with some embodiments of the present disclosure. The plate heat exchanger 720 includes multiple plates 722. The plates 722 are arranged to be separate from each other and are configured to form hot air channels P5 and cool air channels P6.

In some embodiments, as shown in FIG. 7C, the hot air coming from the rack RAK flows through the hot air channels P5, and the outside air coming from the outdoor environment flows through the cool air channels P6. When the hot air and the outside air flow along the two sides of the plates 722, the hot air and the outside air exchange heat through the plates 722. Thus, the hot air transmits heat to the outside air, and the hot air is cooled down.

Reference is made to FIG. 7A again. When the power module SMR, the power system POW, and the electronic devices ED1-ED3 generate the hot air, the first fan 710 is configured to blow the hot air in the rack RAK into the cooling room R3. In some embodiments, the first fan 710 is arranged in the cooling room R3, a hole (not shown in FIG. 7A) is arranged at a position adjacent to the first fan 710 between the cooling room R3 and the rack RAK, so that the first fan 710 can blow the hot air from the rack RAK into the cooling room R3 through the hole.

For illustration of FIG. 7A, the hot air coming from the rack RAK is blown into the hot air channel P5 in the plate heat exchanger 720. For brevity of FIG. 7A, the hot air channel P5 and the cool air channel P6 illustrated in FIG. 7A are merely exemplary. In some embodiments, multiple hot air channels P5 and multiple cool air channels P6 are formed between the plates 722 of the plate heat exchanger 720 as shown in FIG. 7C.

For illustration of FIG. 7A, the second fan 730 is configured to blow the outside air from the outdoor environment into the cooling room R3. The outside air passes through the radiator 740 first and then flows into the cool air channel P6 in the plate heat exchanger 720. In some embodiments, the cooling room R3 includes a hole (not shown in FIG. 7A), and the outside air flows to the outdoor environment through the hole after passing through the cool air channel P6 in the plate heat exchanger 720.

In some embodiments, when the hot air flows into the hot air channels P5 in the plate heat exchanger 720 and the outside air flows into the cool air channel P6 in the plate heat exchanger 720, the plates 722 of the plate heat exchanger 720 are configured to cool down the hot air. The hot air and the outside air exchange heat through the plates 722, and the hot air transmits heat to the outside air.

In some embodiments, the cooling room R3 includes a hole (not shown in FIG. 7A). After the hot air passes through the hot air channels P5 in the plate heat exchanger 720 and is cooled down to the cool air, the first fan 710 is configured to blow the cool air into the rack RAK through the hole.

Through the configuration of the first fan 710, the second fan 730, and the plate heat exchanger 720, the hot air coming from the rack RAK is cooled down by the plate heat exchanger 720 and then flows back into the rack RAK.

For illustration of FIG. 7A, the radiator 740 is arranged in the cooling room R3 and is configured to receive a hot liquid from the electronic devices ED1-ED3 in the rack RAK through the first pipeline P7 and to transmit a cold liquid to the electronic devices ED1-ED3 through the second pipeline P8.

In some embodiments, after the liquid absorbs the heat generated by the electronic devices ED1-ED3, the first pipeline P7 is configured to transmit the hot liquid to the radiator 740. After the radiator 740 cools down the hot liquid to the cold liquid, the second pipeline P8 is configured to transmit the cold liquid back to the electronic devices ED1-ED3, and then the cold liquid exchanges heat with the electronic devices ED1-ED3 again.

In some embodiments, as shown in FIG. 7A, when the radiator 740 receives the outsider air through the second fan 730, the radiator 740 is configured to cool down the hot liquid to the cold liquid. Alternatively stated, when the outside air passes through the radiator 740, the outside air exchanges heat with the hot liquid in the radiator 740, and the hot liquid is cooled down to the cold liquid.

In some embodiments, through the configuration of the cooling system 700 as shown in FIG. 7A, after the outside air is blown into the cooling room R3 by the second fan 730, the outside air flows through the radiator 740 first, then flows through the plate heat exchanger 720, and flows to the outdoor environment through the hole of the cooling room R3 that is adjacent to the plate heat exchanger 720. In various embodiments, the cooling system 700 has a configuration different from the one shown in FIG. 7A. After the outside air is blown into the cooling room R3 by the second fan 730, the outside air passes through the plate heat exchanger 720 first, then the radiator 740, and flows out to the outdoor environment through the hole of the cooling room R3.

In some embodiments, as shown in FIG. 7A, the pump 750 is arranged at a portion of the second pipeline P8. When the cold liquid flows to the pump 750 through the second pipeline P8, the pump 750 is configured to apply pressure to the cold liquid to increase the velocity of the cold liquid, in order to transmit the cold liquid to the electronic devices ED1-ED3. In various embodiments, the pump 750 is arranged at a portion of the first pipeline P7. When the hot liquid flows to the pump 750 through the first pipeline P7, the pump 750 is configured to increase the velocity of the hot liquid.

Compared with the cooling system 100 as shown in FIG. 1, the cooling system 700 adopts different air-cooling devices and uses the plate heat exchanger 720, and uses the water-cooling devices that are similar to the ones used in the cooling system 100. Alternatively stated, the cooling system 700 uses the configuration of the radiator 740, the first pipeline P7, and the second pipeline P8 to exhaust the heat generated by the electronic devices ED1-ED3 out of the rack RAK. In addition, the water-cooling devices described in the embodiments of FIGS. 4A, 5, and 6A can be used in the cooling system 700 shown in FIG. 7A.

In conclusion, the present disclosure provides cooling systems having both the air-cooling devices and the water-cooling devices. The air-cooling devices use configuration of the evaporator and the condenser or the configuration of the plate heat exchanger. The water-cooling devices use configuration of the water-cooling plate or use the configuration that the electronic devices are soaked in the dielectric fluid. Accordingly, the heat generated by the devices inside the rack can be effectively transmitted out of the rack, and the performance of the devices inside the rack can be maintained.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A cooling system, comprising:
an air-cooling device, comprising:
a first fan, arranged in a first cooling room and configured to blow a hot air inside a rack into a first cooling room;
an evaporator, arranged in the first cooling room;
a first condenser, arranged in a second cooling room; and
a second fan, arranged in the second cooling room and configured to blow an outside air into the second cooling room;
wherein, in response to the evaporator receiving the hot air through the first fan, the evaporator is configured to heat a refrigerant into a gaseous state and transmit the refrigerant to the first condenser through a first pipeline;
in response to the first condenser receiving the outside air through the second fan, the first condenser is configured to condense the refrigerant into a liquid state and transmit the refrigerant to the evaporator through a second pipeline; and
a water-cooling device, comprising:
a radiator, arranged in the second cooling room and configured to receive a hot liquid from an electronic device in the rack through a third pipeline and transmit a cold liquid to the electronic device through a fourth pipeline;
wherein, in response to the radiator receiving the outside air through the second fan, the radiator is configured to cool down the hot liquid to the cold liquid.

2. The cooling system of claim 1, wherein the water-cooling device further comprises:
a cooling plate, the cooling plate contacting the electronic device, the cooling plate being configured to transmit the hot liquid to the radiator through the third pipeline and receive the cold liquid from the radiator through the fourth pipeline.

3. The cooling system of claim 1, wherein the water-cooling device further comprises:
a tank, configured to store a dielectric fluid and soak the electronic device into the dielectric fluid.

4. The cooling system of claim 3, wherein the water-cooling device further comprises:
a second condenser, arranged in the tank and connected to the third pipeline and the fourth pipeline;
wherein, in response to the dielectric fluid being heated into a gaseous state by the electronic device, the second condenser is configured to condense the dielectric fluid into a liquid state.

5. The cooling system of claim 1, further comprising:
an isolation wall, arranged between the first cooling room and the second cooling room and configured to prevent the hot air that is blown into the first cooling room by the first fan from flowing into the second cooling room and to prevent the outside air that is blown into the second cooling room by the second fan from flowing into the first cooling room.

6. The cooling system of claim 5, wherein the isolation wall includes at least one hole, the at least one hole is configured to allow the first pipeline, the second pipeline, the third pipeline, and the fourth pipeline to pass through the isolation wall.

7. The cooling system of claim 5, wherein after the first fan blows the hot air into the first cooling room, the isolation wall is further configured for the hot air to flow along the isolation wall to the evaporator.

8. The cooling system of claim 5, wherein after the second fan blows the outside air into the second cooling room, the isolation wall is further configured for the outside air to flow along the isolation wall to the first condenser.

9. The cooling system of claim 1, wherein the first fan is arranged at a relatively high position, and the second fan is arranged at a relatively low position.

10. The cooling system of claim 1, wherein in response to the evaporator receiving the refrigerant in the liquid state from the second pipeline, the first fan is further configured to blow into the rack a cool air that is cooled down by the refrigerant.

11. The cooling system of claim 1, further comprising:
a pump, arranged at a portion of the fourth pipeline, wherein, in response to the cold liquid flowing to the pump through the fourth pipeline, the pump is configured to apply pressure to the cold liquid in order to transmit the cold liquid to the electronic device.

12. A cooling system, comprising:
a plate heat exchanger, comprising a plurality of plates, the plurality of plates being configured to form at least one hot air channel and at least one cool air channel;
a first fan, configured to blow a hot air inside a rack into the at least one hot air channel of the plate heat exchanger;
a second fan, configured to blow an outside air into the at least one cool air channel of the plate heat exchanger;
wherein, in response to the hot air flowing through the at least one hot air channel and the outside air flowing through the at least one cool air channel, the plurality of plates are configured to cool down the hot air; and
a water-cooling device, comprising:
a radiator, configured to receive a hot liquid from an electronic device in the rack through a first pipeline and transmit a cold liquid to the electronic device through a second pipeline;
wherein, in response to the radiator receiving the outside air through the second fan, the radiator is configured to cool down the hot liquid to the cold liquid.

13. The cooling system of claim 12, wherein the water-cooling device further comprises:
a cooling plate, the cooling plate contacting the electronic device, the cooling plate being configured to transmit the hot liquid to the radiator through the first pipeline and receive the cold liquid from the radiator through the second pipeline.

14. The cooling system of claim 12, wherein the water-cooling device further comprises:
a tank, configured to store a dielectric fluid and soak the electronic device into the dielectric fluid.

15. The cooling system of claim 14, wherein the water-cooling device further comprises:
a condenser, arranged in the tank and connected to the first pipeline and the second pipeline;
wherein, in response to the dielectric fluid being heated into a gaseous state by the electronic device, the condenser is configured to condense the dielectric fluid into a liquid state.

16. The cooling system of claim 12, wherein after the hot air flows through the at least one hot air channel and is cooled down to a cool air, the first fan is further configured to blow the cool air into the rack.

17. The cooling system of claim 12, wherein the first fan is arranged at a relatively high position, and the second fan is arranged at a relatively low position.

18. The cooling system of claim 12, further comprising:
a cooling room, abutting the rack, wherein the plate heat exchanger, the first fan, the second fan, and the radiator are arranged in the cooling room.

19. The cooling system of claim 18, wherein the second fan is further configured to blow the outside air into the cooling room, so that the outside air passes through the radiator first and then flows into the at least one cool air channel in the plate heat exchanger.

20. The cooling system of claim 12, further comprising:
a pump, arranged at a portion of the second pipeline, wherein, in response to the cold liquid flowing to the pump through the second pipeline, the pump is configured to apply pressure to the cold liquid in order to transmit the cold liquid to the electronic device.

* * * * *